United States Patent [19]

Adam et al.

[11] 3,869,786

[45] Mar. 11, 1975

[54] SEMICONDUCTOR COMPONENT AND ITS METHOD OF MANUFACTURING

[75] Inventors: Fritz Gunter Adam, Freiburg; Albrecht Renz, Hugstetten, both of Germany

[73] Assignee: ITT Industries, Inc., New York, N.Y.

[22] Filed: Oct. 10, 1973

[21] Appl. No.: 405,222

[30] Foreign Application Priority Data

Oct. 21, 1972 Germany ............................ 2251823

[52] U.S. Cl. ......................... 29/571, 29/580, 29/578

[51] Int. Cl. ............................................. B01j 17/00

[58] Field of Search ........................ 29/571, 578, 580

[56] References Cited

UNITED STATES PATENTS

| | | | |
|---|---|---|---|
| 3,534,234 | 10/1970 | Clevenger | 29/580 |
| 3,752,711 | 8/1973 | Kooi | 29/571 |
| 3,815,223 | 6/1974 | Allison | 29/580 |

*Primary Examiner*—Roy Lake
*Assistant Examiner*—W. C. Tupman
*Attorney, Agent, or Firm*—John T. O'Halloran; Menotti J. Lombardi, Jr.; Vincent Ingrassia

[57] ABSTRACT

This invention relates to a MOS semiconductor device having a mesa-shaped projection concentrically surrounded by a field plane electrode processed in a self-aligning etching method upon an insulating surface layer of the semiconductor body. The inventive etching method makes use of a top stratum and an etch masking layer which have different rates for aligning the field plane electrode.

13 Claims, 23 Drawing Figures

SEMICONDUCTOR COMPONENT AND ITS METHOD OF MANUFACTURING

BACKGROUND OF THE INVENTION

This invention relates to the masked oxidation of semiconductor bodies, particularly silicon bodies, using an oxidation masking layer, particularly silicon nitride, masking the oxidation by providing for the forming of mesa-shaped projections projecting over a plane surface of a semiconductor body. Such methods are known journal the fournal "Philips Research Reports" 26 (1971), pp. 157 to 165, and the journal "Electronics" of Dec. 20, 1971, pp. 44 to 48.

Further, from the journal "Electronics Letters" of Jan. 14, 1971, Vol. 7, No. 1, pp. 12 and 13 it is known to use a field plane layer of polycrystalline silicon produced without requiring any additional manufacturing steps, in the course of performing the silicon-gate diffusion. This method of manufacturing MIS field-effect transistors is described in the journal "Solid State Electronics" Vol. 11 (1968), pp. 653 to 660. It offers the advantage of "self-aligning" of the gate electrode with respect to the source and drain regions of an MIS field-effect transistor.

SUMMARY OF THE INVENTION

The invention is based on the idea of embodying the semiconductor components of integrated (solid-state) circuits or semiconductor devices in such a way as to enable a "centric", that is, a self-aligning manufacture. As regards the field plane layer, the invention thus relates to such "self-aligning" methods.

The invention relates to a semiconductor component whose mesa-shaped projection which projects over a plane surface of a semiconductor body of silicon and is covered by an oxidation masking layer, is manufactured by the thermal oxidation of the semiconducting material surrounding the oxidation masking layer.

It is an object of the present invention to provide in such a semiconductor component a field plane layer of such configuration as to enable minimum spacing between the semiconductor components of each meas-shaped projection of an integrated circuit by achieving an optimum shielding effect, because in this case the safety clearances or spacings of the photomasks (photoresist masking layers) as required for the manufacture of the individual semiconductor components, in particular of MIS-field-effect transistors, in the integrated circuit can be reduced to a minimum.

According to a broad aspect of the invention there is provided a semiconductor component comprising a mesa-shaped projection projecting over a plane surface of a semiconductor body of silicon, an insulating intermediate layer, and an electrically conductive field plane layer on said intermediate layer and concentrically surrounding said mesa-shaped projection.

A first preferred type of embodiment of the semiconductor component according to the invention is featured by the fact that the mesa-shaped projection of the semiconductor body together with the surrounding insulating layer, forms one plane on which the conductor patterns and/or the electrodes extend.

A second preferred type of embodiment of the invention is characterized by the fact that the mesa-shaped projection together with the field plane layer which may partly be chemically converted into insulating material, form one plane on which, by being electrically insulated from the field plane layer, there extend conductor patterns and/or electrodes.

Accordingly, in the two aforementioned cases there will result a wiring plane which is extensively free from unevenness, and offering the advantage of permitting the establishment of reliable connections of the semiconductor components over conductor patterns, because the conductor patterns do not have weak points since they do not extend over steps and edges.

According to another aspect of the invention there is provided a method of manufacturing a semiconductor component wherein an electrically conductive field plane layer is manufactured concentrically, in a self-aligning manner on an insulating intermediate layer of a semiconductor body comprising producing a first layer of silicon oxide over a portion of a polished n-type silicon wafer, depositing an oxidation masking layer over said silicon oxide layer, said masking layer extending beyond said silicon oxide layer, thermally oxidizing the exposed surface area of said silicon wafer, etching away the thermally oxidized area leaving a mesa-shaped projection beneath said silicon oxide layer, depositing an insulating layer having a window therein on the exposed surface area of said silicon wafer, depositing a doped polycrystalline silicon layer over the exposed surface area of said component, said polycrystalline layer having a thickness substantially equal to the height of said mesa-shaped projection, producing a second layer of silicon oxide on the surface of said polycrystalline layer, producing a window in said second layer concentrically over said mesa-shaped projection, said window having a smaller diameter than said projection, etching through the window in said second layer to the surface of said oxidation masking layer, removing said oxidation masking layer, etching away said second layer, said first layer and that portion of said doped polycrystalline silicon layer lying above said projection and extending outwardly from the space previously occupied by said oxidation masking layer, depositing a gate oxide layer over the entire surface area of said component, applying a second coating of polycrystalline silicon over said gate oxide layer, forming an oxide film over said second coating, oxide etching said second coating and said gate oxide layer leaving said gate oxide layer and a gate electrode concentrically over said projection and defining a desired conductor pattern over said polycrystalline layer, diffusing source and drain regions into the surface of said projection, depositing an oxide coating over the surface area of said component, etching contact windows over said source and drain regions and said defined conductor pattern, and applying conductors to said source and drain regions and said conductor pattern.

In a first advantageous type of embodiment of such a method, and subsequently to the manufacture of the projection extending in a mesa-shaped manner over the plane surface of the semiconductor body of silicon, and covered by an oxidation masking layer, there is first of all removed, by way of thermal oxidation, the material as resulting from the thermal oxidation of the semiconductor material. The thus exposed semiconductor surface is thereafter provided with an insulating intermediate layer by way of thermal oxidation. Following this, the entire surface side of the semiconductor arrangement is covered with an embedding layer of an electrically conducting material and an etch masking layer arranged on the aforementioned embedding layer. Subsequently thereto, there is produced in this etch masking layer and almost concentrically in relation to the mesa-shaped projection, an opening having a diameter which is smaller than the diameter of the mesa-shaped projection. The embedding layer is etched through with the aid of a first etching agent which only slightly attacks the etch masking layer. Thereafter either the oxidation masking layer or a top stratum applied to the oxidation masking layer subsequently to the thermal oxidation, is removed with the aid of a selectively attacking etching agent. In the course of this, as will be explained in greater detail hereinafter, the oxidation masking layer or the top stratum can be removed extensively and without consideration of the position of the opening in the etch masking layer, exactly up to the edge or rim portion of the mesa-shaped projection without the mesa surface and the etch masking layer being attacked by the etching agent, because the etching attack is slowed down towards the rim portion of the mesa-shaped projection and finally almost comes to a standstill at the rim portion of the mesa-shaped projection owing to the constriction as provided at that point in the embedding layer. Accordingly, the selective removal of the embedding layer above the upper surface of the mesa-shaped projection is possible selectively and extensively independent of the position of the opening in the etch masking layer. In the course of this self-aligning etching process there will remain one portion of the embedding layer which is exactly centered with respect to the mesa-shaped projection and can already be used as the field plane layer. Finally, the mesa surface, for example, by means of an etching process, is exposed for producing an MIS field-effect transistor element on the upper surface of the mesa-shaped projection preferably by employing the well-known planar diffusion method and the likewise well-known silicon-gate technique.

A further advantageous embodiment of the method according to the invention is at first the same as in the embodiment described hereinbefore. Instead of an embedding layer of electrically conducting material, however, there is deposited an embedding layer of insulating material after the entire exposed surface side of the semiconductor arrangement has been previously subjected to the evaporation of a conductive layer of metal. In so doing, there is utilized the fact that during the thermal oxidation of the semiconductor material, besides the oxidation masking layer, there is effected a sub oxidation of the oxidation masking layer, so that in the course of evaporation, vertically in relation to the surface side of the semiconductor body, the mesa-shaped projection is centered exactly with respect to the inner rim portion of the field plane layer. Moreover, by utilizing the effect described with respect to the first embodiment described hereinbefore, the embedding layer is also removed in a self-aligning manner over the mesa-shaped projection, so that the top surface of the mesa-shaped projection together with the embedding layer whose thickness must correspond to the height of the mesa-shaped projection less the thickness of the field plane layer, will result in a plane on which the conductor patterns and/or the electrodes are permitted to extend.

The above objects and features of the present invention will be better understood from the following detailed description taken in conjunction with the accompanying drawings, in which:

FIGS. *3a*, *6a*, *7a*, *7b* *8a*, and *9a* refer to other embodiments of the invention

DESCRIPTION OF THE PREFERRED EMBODIMENT

Figures 1, 2, 3, 4, 5, 6, 7:
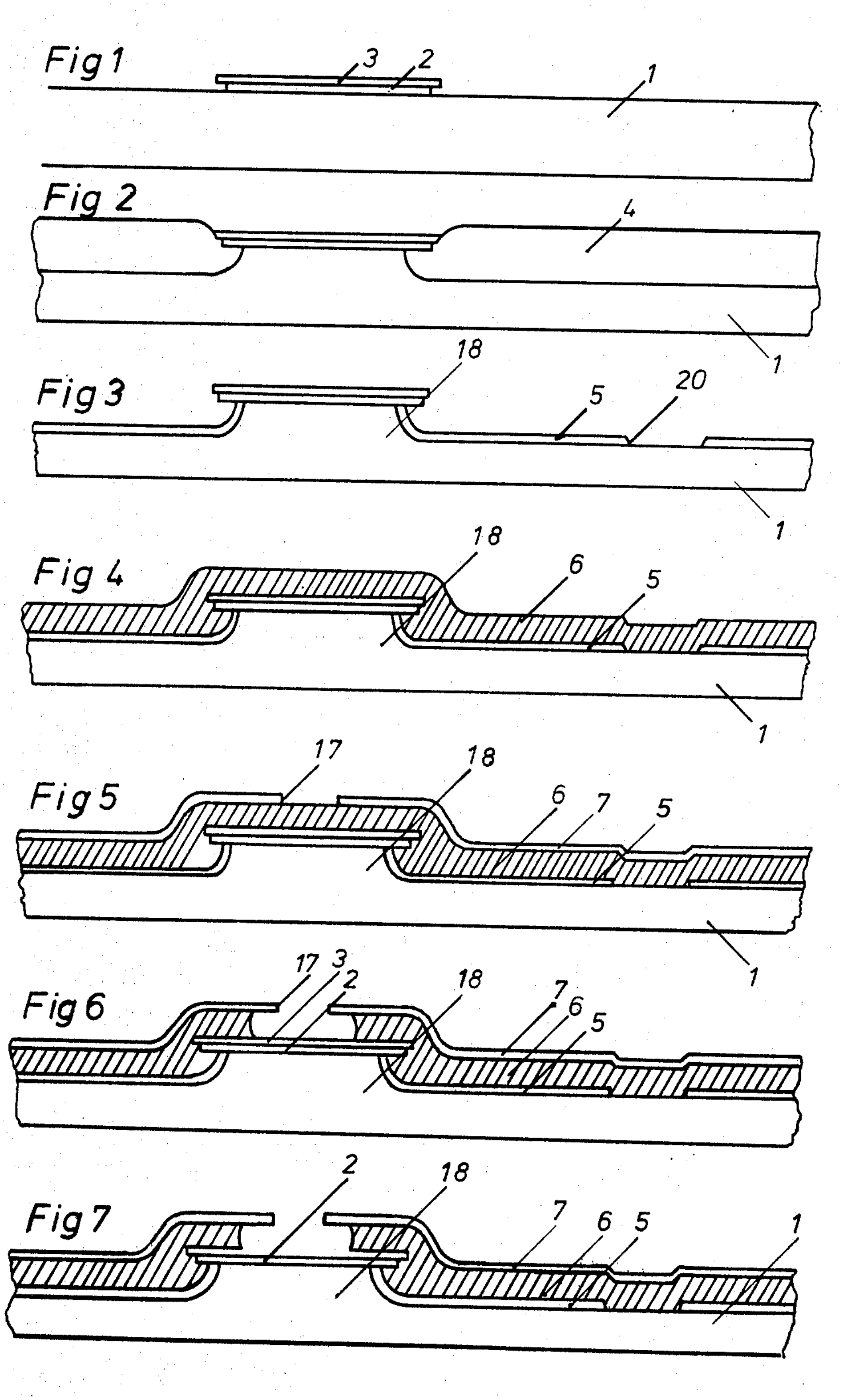
FIGS. 1 to 14 and 14*a* refer to manufacturing steps of a first embodiment of the invention.

FIG. 1 shows a polished n-conducting silicon wafer 1 on which, by way of thermal oxidation or from the gas phase, there has been deposited an etch protecting layer 2 of silicon oxide below an oxidation masking layer 3 according to FIG. 1. For the local application of these layers 2, 3 it is possible to use in the known manner the photolithographic etch masking process, so that subsequently to the etching of the nitride layer and the oxide layer, only the etch protecting layer 2 and the oxidation masking layer 3 will still exist over the future active areas or portions of the semiconductor component.

Subsequently thereto, the wafer is provided in the course of a thermal oxidation process, with a relatively thick layer of a material 4 as resulting from the thermal oxidation of the semiconducting material, which only grows on the areas which have been freed from nitride, and in the conventional manner by using silicon material. The condition as existing after this oxidation is shown in FIG. 2. Thereafter, the material 4 as resulting from the thermal oxidation, is etched away and a new insulating intermediate layer 5 according to FIG. 3 is grown by way of thermal oxidation. At one or more suitable points this layer may be etched through by employing a photolithographic etch masking process, so that one or more small oxide windows will result through which later on the field plane layer 6' will electrically contact the semiconductor body 1. One such contact window 20 is to be seen on the right-hand side in FIG. 3. The mesa-shaped projection 18 projects over the remaining surface.

After this, and as shown in FIG. 4, a polycrystalline silicon layer for serving as an embedding layer 6 is deposited on the silicon disc 1 preferably by the dissociation of silane gas ($SiH_4$). The thickness of this embedding layer 6 shall be approximately between 0.5 and 2 μm corresponding to the height of the mesa-shaped projection 18 and may be doped either in an n- or p-conducting manner already during the deposition. Doping, however, may also be carried out directly after the deposition, by way of diffusion.

According to FIG. 5, the exposed surface of the embedding layer 6 of polycrystalline silicon, is coated with a thinner etch masking layer 6 of silicon oxide which may be produced by way of thermal oxidation of the surface or else by way of deposition from the gas phase. Over the mesa-shaped projection 18 which later on contains the active areas of the field-effect transistor, there is produced an opening 17 lying almost concentrically in relation to the mesa-shaped projection 18, because an exact centering is practically impossible and is also not necessary in connection with the inventive method. The opening 17 in the etch masking layer 7 has a smaller diameter than the diameter of the upper surface of the mesa-shaped projection 18. One advantage of the inventive method is to be seen in that the rim portions of the mesa-shaped projection 18 and of the opening 17 do not need to extend in parallel, i.e., both do not need to describe a circle, for example.

Thereafter, and as illustrated in FIG. 6 the embedding layer 6 is subjected to the beginning of an etching process through the opening 17 by using a suitable silicon etching solution, for example, a mixture consisting of hydrofluoric acid, nitric acid and water, until there appears the diffusion masking layer 3 of silicon nitride.

As may be taken from FIG. 7, there is thereafter removed the diffusion masking layer 3 of silicon nitride up to the edge in a hot phosphoric acid. A further etching in the silicon etching solution extending from the space which was previously occupied by the removed diffusion masking layer 3, leads to the arrangement as shown in FIG. 8.

The silicon etching solution attacks the polycrystalline silicon from the cavity which, in FIG. 6, was still filled by the diffusion masking layer 3. Accordingly, the etching time is therefore only determined by the thickness of the embedding layer 6 of a polycrystalline silicon, and not by the distance from or spacing between the edge of the mesa-shaped projection. The thickness of the etch protecting layer 2 and of the etch masking layer 7 is chosen thus that these layers, subsequently to the etching through of the silicon, will only still exist as a thin film over the mesa-shaped projection. This is possible because the silicon etching solution attacks the oxide at least by a factor 10 slower than the polycrystalline silicon. Subsequently thereto, the remainders of the etch protecting layer 2 and of the etch masking layer 7 are removed in a solution selectively etching the silicon oxide.

Figures 8, 9, 10, 11, 12, 13, 14:
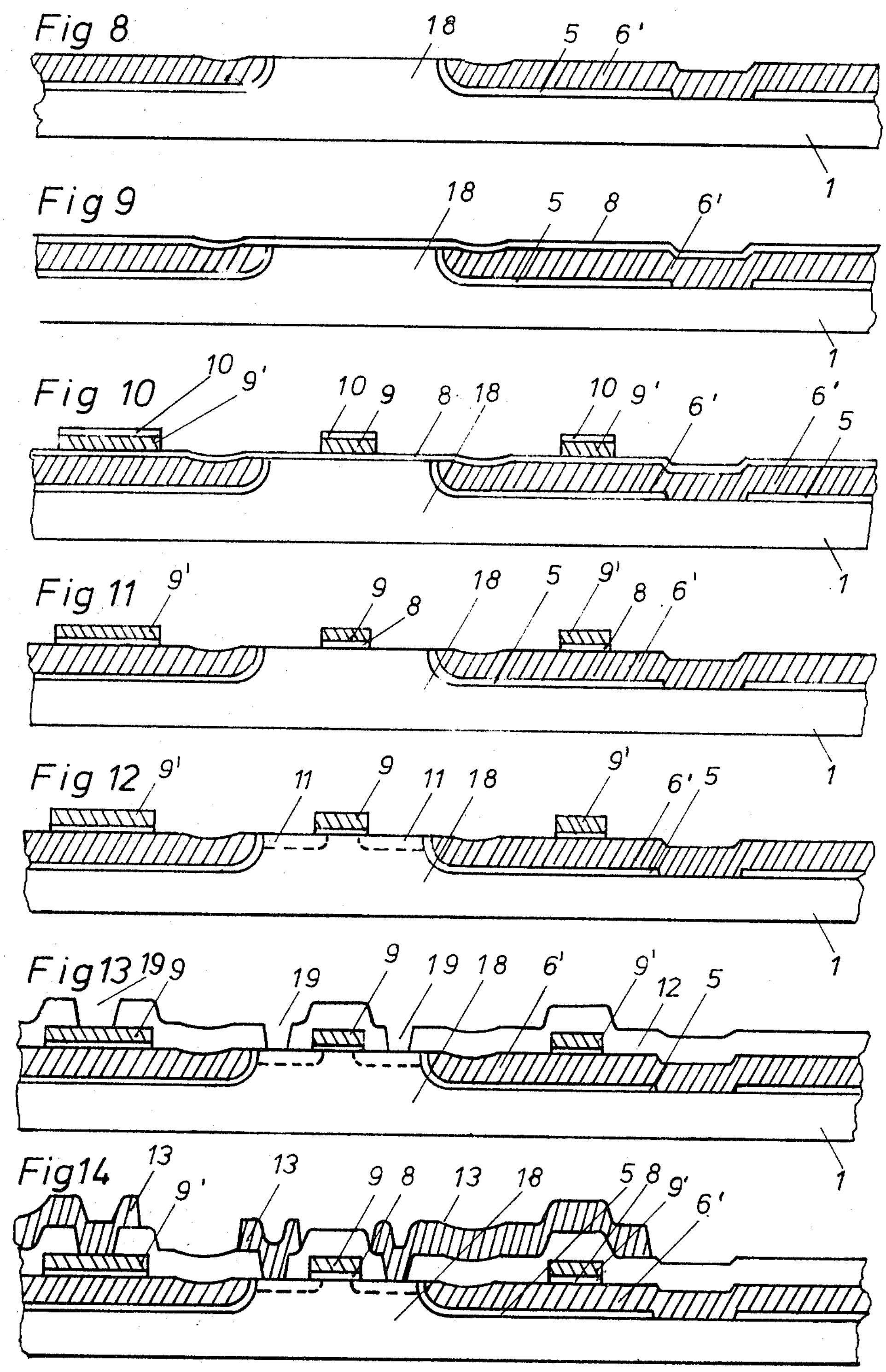

As a next step, according to FIG. 9, there is deposited the gate oxide layer 8 either thermally or from the gas phase.

In the further course of this, there is employed the well-known silicon gate technique:

1. Applying a coating of polycrystalline silicon, and over this a thin oxide film 10 according to FIG. 10, in the course of which conductor patterns 9' may be provided for in addition to the silicon-gate electrode 9 of the field-effect transistor element.
2. Oxide etching according to FIG. 11 by removing those parts of the gate-oxide lyaer 8 which are not covered by the electrode 9 and the conductor patterns 9'.
3. Diffusing the region 11 — source region and drain region — according to FIG. 12.
4. Applying the oxide coating 12 in a thickness ranging from 0.5 to 1.0 μm, and etching the contact window 19 according to FIG. 13.
5. Applying the conductor patterns 13 according to FIG. 14.

The described first type of embodiment has the disadvantage that the conductor patterns 9' of a polycrystalline silicon, also outside the active areas of the semiconductor component, are separated from the field plane layer 6' only by means of the thin gate oxide layer 8. This results in additional unwanted load capacitances. This disadvantage is avoided in the types of embodiment to be described hereinafter.

Figure 15:
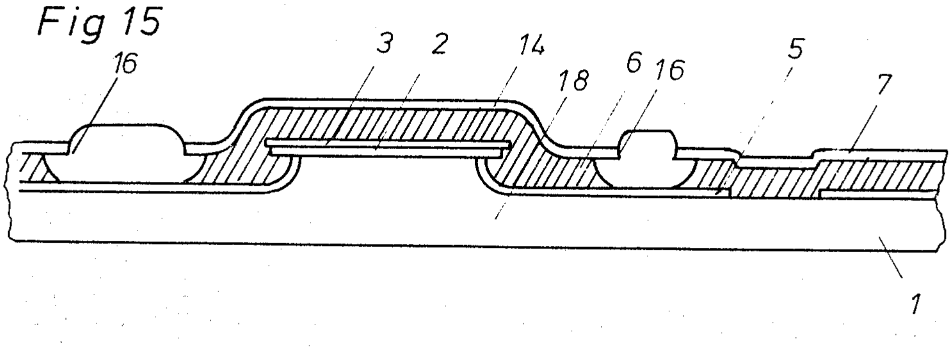
FIGS. 15 and 16 refer to a second embodiment of the invention.
Figure 16:
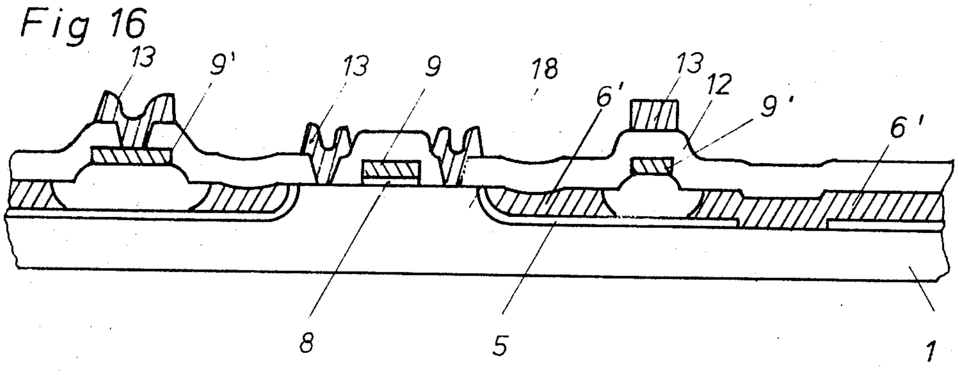

In a second type of embodiment of the inventive method there is started out from an arrangement corresponding to the one shown in FIG. 4, which this arrangement being provided with an etch masking layer 7, this time, however, consisting of silicon nitride. This etch masking layer 7 of a silicon nitride, is provided in accordance with FIG. 15, in well-known manner with further openings 16, i.e., below the conductor patterns 9' which are later on still to be applied on to the embedding layer 6. Thereafter, the polycrystalline silicon of the embedding layer 6 is thermally oxidized, e.g., in a humid atmosphere, through said further openings 16, so that locally thick oxide patches will be obtained at those points over which the conductor patterns 9' are to extend later on. This condition is shown in FIG. 15. The capacitance of the conductor patterns 9' towards the field plane layer 6 is thus reduced to the usual small value. Subsequently to the oxidation through said further openings 16, the etch masking layer 7 of silicon nitride, is etched in a hot phosphoric acid. Thereafter, the etch masking layer 7 of silicon oxide is deposited, as is shown in FIG. 5, and the further steps of the process are the same as those of the first example of embodiment. The final condition of this type of embodiment provided with the local oxide patches below the conductor patterns 9' is shown in FIG. 16.

Figures 3A, 6A, 7A, 7B, 8A, 9A:
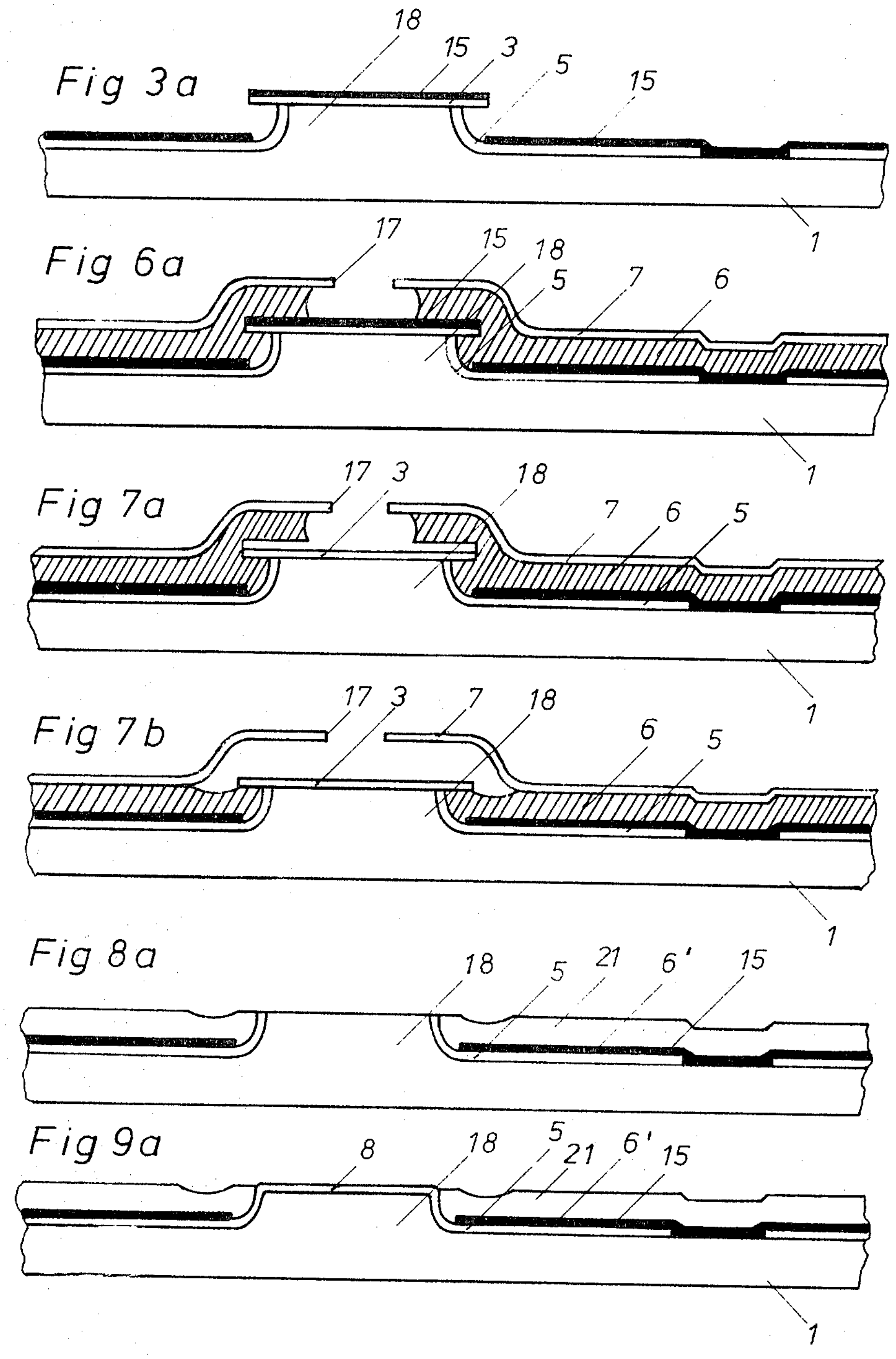
Figure 14A:
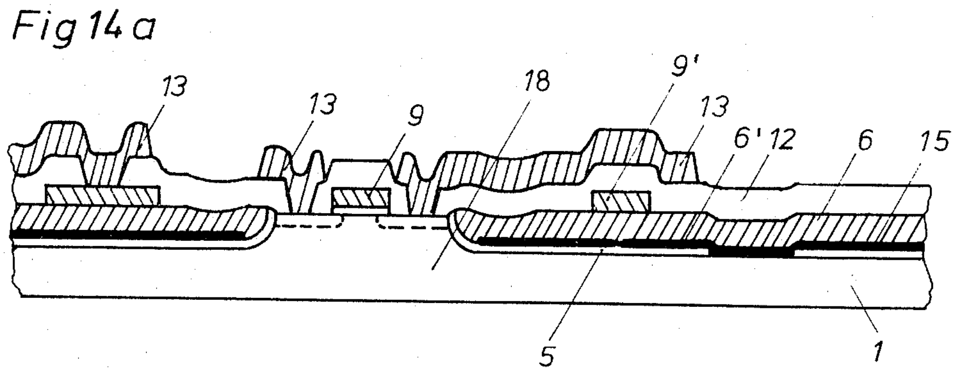

In a further type of embodiment of the inventive method there is started from an arrangement corresponding to that shown in FIG. 3, which is provided in accordance with FIG. 3*a*, vertically in relation to the exposed surface, and by way of evaporation of a metal, preferably of molybdenum or tungsten, with a conductive layer 15. In the course of this, and as is randomly possible in this particular type of embodiment, the etch protecting layer 2 below the oxidation masking layer 3 on the mesa-shaped projection has been omitted. Thereafter, there is proceeded in the same manner as shown in FIG. 4, and an embedding layer 6 of polycrystalline silicon is deposited. Subsequently thereto, the etch masking layer 7 is produced, as described with reference to FIG. 5, and the embedding layer 6 is etched through down to the conducting layer 15 over the mesa according to FIG. 6*a*. Following this, the conducting layer 15 is etched away over the mesa according to FIG. 7*a*, in order thus to provide an area of attack for the subsequently following silicon etching on the polycrystalline silicon lying thereabove, over the entire mesa surface. Etching of the polycrystalline silicon of the embedding layer 6 will result in an arrangement corresponding to that shown in FIG. 7*b*. Thereupon there is etched away the etch masking layer 7. Subsequently thereto and preferably in a damp or humid atmosphere, the entire, still existing embedding layer 6 of polycrystalline silicon, is oxidized through around the mesa-shaped projection. In the course of this the upper surface of the mesa-shaped projection 18 is still covered by the oxidation masking layer 3 of silicon nitride, and is thus protected against oxidation. Normally, the oxidation masking layer 3 of silicon nitride and, if existing, the etch protecting layer 2, are etched away from the mesa-shaped projection, as is shown in FIG. 8*a*, and in the case of manufacturing a MIS field-effect transistor component according to FIG. 9*a*, there is deposited a fresh gate oxide. The further steps of the process are the same as those described with reference to FIGS. 10 to 14 of the first example of embodiment already explained hereinbefore. The finished semiconductor device is illustrated in FIG. 14*a* showing the field plane layer 6' of molybdenum or tungsten, and the relatively thick embedding layer 6 of silicon oxide, solving the aforementioned capacitance problem.

The performance of a further example of embodiment of the inventive method, is particularly simple. In this case the embedding layer 6 is deposited from the beginning as an oxide layer, and not as a polycrystalline silicon layer, for being converted into silicon oxide only later on either locally, as in the case of the second example of embodiment, or completely (i.e., outside or around the mesa-shaped projection), as is the case in the third example of embodiment. In order to be able to take the steps and measures which are of importance in accordance with the inventive process, also in this case, only to effect the self-aligning removal of the embedding layer 6 over the mesa-shaped projection 18, however, the etch masking layer 7 must be made of silicon nitride in order to achieve a considerably differentiated etchability. Moreover, and particularly with respect to the layer of metal 15 as produced by way of evaporation vertically in relation to the semiconductor disc 1, the further steps of the process are the same as those described with reference to the third example of embodiment shown in FIG. 3*a*. The embedding layer 6, of course, as already described with reference to FIGS. 6*a* and 7*b*, is treated with an oxide etching solution, in the course of which, and in this particular example of embodiment, the surface of the mesa-shaped projection as well as the parts of the embedding layer 6 lying apart, are protected by both the oxidation masking layer 3 and the etch masking layer 7 of silicon nitride. An arrangement according to FIG. 8*a* is obtained by etching away these silicon nitride layers, for example, in a hot phosphoric acid. The finished device according to FIG. 14*a*, is identical to that of the third examlpe of embodiment.

A fifth example of embodiment only differs from the fourth example of embodiment as described hereinbefore, in that instead of the layer of metal 15, there is deposited a thin polycrystalline and highly doped silicon layer. Preferably, the application of the highly doped silicon is also effected in this case by way of vertical evaporation in the vacuum. This step of the method leading to an arrangement as shown in FIG. 7*a*, is also possible in this particular example of embodiment, because during the silicon etching by which there is removed the portion of the layer 15 of a polycrystalline and highly doped silicon as extending over the mesa-shaped projection, the portion of the embedding layer 6 of silicon oxide as lying thereabove, is only attacked very much slower. The self-aligned removal of the portion of the embedding layer 6 lying over the mesa-shaped projection 18, is effected thereafter in an oxide etching solution.

Decisive for the realizability of the semiconductor component according to the invention in which a mesa-shaped projection is exactly concentrically surrounded by the rim portion of an electrically conducting field plane layer 6' on an insulating intermediate layer, is the different etchability of the embedding layer 6 as compared to the oxidation masking layer 3, and the different etchability of these two layers as compared to the tech protecting layer 2 and the etch masking layer 7, as is recognizable from these examples of embodiment.

Moreover, it can be recognized from these examples of embodiment that the trick which is essential for the method according to the invention, resides in providing, in a self-aligning manner in relation to the plane surface of the mesa-shaped projection 18, a hollow space or cavity from where the embedding layer 6 of an electrically conductive material or an insulating material, is attached by the etching in a self-aligning manner in relation to the mesa-shaped projection 18, so that in the case of a self-aligning manufacture of the field plane layer 6', and in cases where the embedding layer 6 has a thickness which is about equal to the height of the mesa-shaped projection 18 less the thickness of the insulating intermediate layer 5 — if so required, plus the thickness of the layer of metal or of polycrystalline silicon 15 - there is provided an extensively trouble-free plane for depositing the conductor patterns 9*a* and the gate electrode 9. At least, the unevennesses are so small that there cannot occur any substantial weakening of the conductor patterns 9' at sharper edges.

Arranging the screen layer 6' in a semiconductor component according to the invention, offers the advantage that the so-called field threshold voltage, with the aid of the metalically or well-semiconducting field plane layer, can be adjusted to be arbitrarily high on the entire semiconductor surface outside the upper surface of the mesa-shaped projection 18, in that it is applied by way of contacting at one point, to a fixed potential, such as substrate potential. The advantage of a thus increased field threshold voltage is to be seen in that with the operating voltages of the MIS switching circuit it is possible to go up to the limit as determined by the breakdown voltage, and that in this way, for example, by a high $U_{GG}$ (ca. 30 V), it is possible to increase the switching speed of the switching circuit. In the semiconductor component according to the invention, the advantages offered by the semiconductor components manufactured by using oxidation masking layers, and semiconductor components produced with a field screening by means of field plane layers, are combined in a particularly favorable manner.

Although the inventino can be most advantageously applied to silicon-gate field-effect elements, in particular transistors, there will also result advantages with respect to field-effect semiconductor components employing a metal gate, and also in the case of bipolar semiconductor components which are capable of being realized by starting out from an arrangement according to FIGS. 8 or 8*a*, in particular by employing the well-known planar diffusion method. Moreover, also in the case of bipolar semiconductor components it may be useful to provide for a field screening for the purpose of suppressing inversion layers.

While we have described above the principles of our invention in connection with specific apparatus, it is to be clearly understood that this description is made only by way of example and not as a limitation of the scope of our invention as set forth in the objects thereof and in the accompanying claims.

What is claimed is:

1. A method of manufacturing a semiconductor component wherein an electrically conductive field plane layer is manufactured concentrically, in a self-aligning manner on an insulating intermediate layer of a semiconductor body comprising:

producing a first layer of silicon oxide over a portion of a polished end-type silicon wafer;

depositing an oxidation masking layer over said silicon oxide layer, said masking layer extending beyond said silicon oxide layer;

thermally oxidizing the exposed surface area of said silicon wafer;

etching away the thermally oxidized area leaving a mesa-shaped projection beneath said silicon oxide layer;

depositing an insulating layer having a window therein on the exposed surface area of said silicon wafer;

depositing a doped polycrystalline silicon layer over the exposed surface area of said component, said polycrystalline layer having a thickness substantially equal to the height of said mesa-shaped projection;

producing a second layer of silicon oxide on the surface of said polycrystalline layer;

producing a window in said second layer concentrically over said mesa-shaped projection, said window having a smaller diameter than said projection;

etching through the window in said second layer to the surface of said oxidation masking layer;

removing said oxidation masking layer;

etching away said second layer, said first layer and that portion of said doped polycrystalline silicon layer lying above said projection and extending outwardly from the space previously occupied by said oxidation masking layer;

depositing a gate oxide layer over the entire surface area of said component;

applying a second coating of polycrystalline silicon over said gate oxide layer;

forming an oxide film over said second coating;

oxide etching said second coating and said gate oxide layer leaving said gate oxide layer and a gate electrode concentrically over said projection and defining a desired conductor pattern over said polycrystalline layer;

diffusing source and drain regions into the surface of said projection;

depositing an oxide coating over the surface area of said component;

etching contact windows over said source and drain regions and said defined conductor pattern; and applying conductors to said source and drain regions and said conductor pattern.

2. A method according to claim 1 wherein said oxidation masking layer is silicon nitride.

3. A method according to claim 1 wherein said doped polycrystalline silicon layer is p-doped.

4. A method according to claim 1 wherein said doped polycrystalline silicon layer is n-doped.

5. A method according to claim 1 wherein said doped polycrystalline silicon has a thickness between 0.5 and 2 $\mu$m.

6. A method according to claim 1 wherein said second layer is produced by thermal oxidation.

7. A method according to claim 1 wherein the windows in said second layer are etched with hydrofluoric acid, nitric acid and water.

8. A method according to claim 1 wherein said oxidation masking layer is removed with hot phosphoric acid.

9. A method according to claim 1 wherein said oxide coating over the surface area of said component has a thickness between 0.5 and 1.5 $\mu$m.

10. A method according to claim 1 wherein said etch masking layer is silicon nitride further including the steps of:

depositing a layer of silicon nitride prior to the deposition of said second layer;

providing openings in said silicon nitride layer at those positions which correspond to a desired conductor pattern;

thermally oxidizing in a human atmosphere said doped polycrystalline layer to form thick oxide patches at those points over which a conductor pattern will be formed; and etching away in hot phosphoric acid the remaining portions of said silicon nitride layer.

11. A method of manufacturing a semiconductor component wherein an electrically conductive field plane layer is manufactured concentrically, in a self-aligning manner on an insulating intermediate lyer of a semiconductor body comprising:

depositing a silicon nitride masking layer over a portion of a polished end-type silicon wafer;

thermally oxidizing the exposed surface area of said silicon wafer;

etching away a thermally oxidized area leaving a mesa-shaped projection beneath said silicon nitride layer;

depositing an insulating layer having a window therein on the exposed surface area of silicon wafer;

evaporating a layer of metal on said insulating layer;

depositing a doped polycrystalline silicon layer over the exposed surface area of said component, said polycrystalline layer having a thickness substantially equal to the height of said mesa-shaped projection;

producing a first layer of silicon oxide on the surface of said polycrystalline layer;

producing a window in said first layer concentrically over said mesa-shaped projection, said window having a smaller diameter than said projection;

etching through the window in said first layer to the surface of said metal masking layer;

etching away said metal layer;

etching away said first layer, and that portion of said doped polycrystalline silicon layer lying above said projection and extending outwardly from the space previously occupied by said metal layer;

depositing a gate oxide layer over the entire surface area of said component;

applying a second coating of polycrystalline silicon over said gate oxide layer;

forming an oxide film over said second coating;

oxide etching said second coating and said gate oxide layer leaving said gate oxide layer and a gate electrode concentrically over said projection and defining a desired conductor pattern over said doped polycrystalline layer;

diffusing source and drain regions into the surface of said projection;

depositing an oxide coating over the surface area of said component;

etching contact windows over said source and drain regions and said defined conductor pattern; and applying conductors to said source and drain regions and said conductor pattern.

12. A method according to claim 11 wherein said metal is molybdenum.

13. A method according to claim 11 wherein said metal is tungsten.

* * * * *